United States Patent
Salmon (10) Patent No.: US 9,641,940 B2
(45) Date of Patent: May 2, 2017

(54) METALIZED MICROPHONE LID WITH INTEGRATED WIRE BONDING SHELF

(71) Applicant: Robert Bosch GmbH, Stuttgart (DE)

(72) Inventor: Jay Scott Salmon, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 32 days.

(21) Appl. No.: 14/703,233

(22) Filed: May 4, 2015

(65) Prior Publication Data

US 2016/0212548 A1   Jul. 21, 2016

Related U.S. Application Data

(60) Provisional application No. 62/076,084, filed on Nov. 6, 2014.

(51) Int. Cl.

| H01L 29/78 | (2006.01) |
|---|---|
| H04R 19/04 | (2006.01) |
| B81C 1/00 | (2006.01) |
| B81B 7/00 | (2006.01) |

(52) U.S. Cl.
CPC ............. *H04R 19/04* (2013.01); *B81B 7/007* (2013.01); *B81C 1/0023* (2013.01); *B81B 2201/0257* (2013.01); *B81B 2207/012* (2013.01); *B81B 2207/07* (2013.01); *B81C 2203/019* (2013.01); *B81C 2203/0109* (2013.01); *B81C 2203/0792* (2013.01); *H04R 2201/003* (2013.01)

(58) Field of Classification Search
CPC .................. H04R 19/04; B81C 1/0023; H01L 2924/1461
See application file for complete search history.

(56) References Cited

U.S. PATENT DOCUMENTS

| 8,842,858 B2 | 9/2014 | Lillelund |
| 8,842,859 B2 | 9/2014 | Delaus et al. |
| 9,002,038 B2 | 4/2015 | Ochs et al. |
| 9,238,579 B2 | 1/2016 | Ochs et al. |
| 2009/0243060 A1 | 10/2009 | Saitoh |
| 2010/0155863 A1 | 6/2010 | Weekamp |
| 2013/0343590 A1 | 12/2013 | Nakagawa et al. |
| 2014/0254835 A1 | 9/2014 | Yakura |
| 2014/0264654 A1 | 9/2014 | Salmon |

FOREIGN PATENT DOCUMENTS

| JP | 2013074151 A | 4/2013 |
| WO | 2014040017 A1 | 9/2013 |

*Primary Examiner* — Elias M Ullah
(74) *Attorney, Agent, or Firm* — Michael Best & Friedrich LLP (57) ABSTRACT

A MEMS microphone package and a method of manufacturing a MEMS microphone package having a lid and a substrate cap. The lid includes a wire bonding shelf that provides a surface internal to the MEMS microphone for connection points for internal wire bonds. One or more conductive traces deposited on the bonding shelf are provided to connect internal electronic components via the wire bonds to a substrate cap. The substrate cap is configured to connect to external devices or components. The internal electronic components include a MEMS microphone die and an application specific integrated circuit. The internal electronic components are configured to transmit signals to external electronics indicative of acoustic energy received by the MEMS microphone die by the configurations described herein.

11 Claims, 13 Drawing Sheets

METALIZED MICROPHONE LID WITH INTEGRATED WIRE BONDING SHELF

BACKGROUND

Embodiments of the present invention relate to microelectricalmechanical (MEMS) microphone packages and methods of their construction.

SUMMARY

In one embodiment, the invention provides a microelectricalmechanical (MEMS) microphone package including a substrate cap having an interior and exterior surface. The MEMS microphone package also including a molded lid having an interior and exterior surface attached to the substrate cap such that the substrate cap and the lid form a cavity in the MEMS microphone package. The lid has an acoustic porthole and a MEMS microphone die positioned proximal to the porthole. A bonding shelf is a molded structure located within a portion of the cavity. The bonding shelf includes a first electrical trace deposited on the bonding shelf. The first electrical trace has a first end connected to a bonding wire and a second end connected to a contact pad on an interior surface of the substrate cap.

In another embodiment the invention provides a method of constructing a plurality of MEMS microphone packages by forming a plurality of lids on a first array, each of the plurality of lids having an acoustic porthole and a wire bonding shelf. The wire bonding shelf including conductive traces that extend from an internal surface within the MEMS microphone package to a substrate cap connection point. A plurality of substrate caps are formed on a second array. Epoxy is deposited on a portion of an interior surface of each of the lids and a MEMS microphone die and an application specific integrated circuit (ASIC) die is fixed to each of the lids with the epoxy. The epoxy is then cured. The MEMS microphone die and the ASIC die are connected such that the ASIC die is connected to at least one of the conductive traces with wire bonds. The method includes connecting the first array and the second array such that the substrate cap connection points connect to respective substrate connection pads for each of the plurality of lids. The combination of the lids and substrate caps are singulated to form a plurality of individual MEMS microphone packages.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In one embodiment, a microelectricalmechanical (MEMS) microphone package includes a cavity in the interior of the microphone package. An acoustic port in the microphone package allows acoustic pressure (i.e., sound) to enter the microphone package. A MEMS microphone die detects the acoustic pressure and coverts the acoustic pressure into an electrical signal. The electrical signal is representative of the acoustic pressure received at a diaphragm of the MEMS microphone die. An application specific integrated circuit (ASIC) receives the signal from the MEMS microphone die and processes the signal. The output of the ASIC is transmitted via conduction paths to a substrate that forms a cap on the MEMS microphone package.

Original equipment manufacturers produce MEMS microphone packages in a variety of configurations. Among these configurations are top-port and bottom-port designs. In a top-port design, the acoustic port is formed in a top surface of the microphone package. In this design, the top surface of the MEMS microphone package consists of a lid of the MEMS microphone package. In the bottom-port design, the acoustic port penetrates the bottom surface of the MEMS microphone package. The bottom surface being the substrate that forms a cap of the MEMS microphone package. The following description provides detail of top-ported designs of a MEMS microphone package. However, the design may also be implemented in bottom-ported designs.

Figure 1:
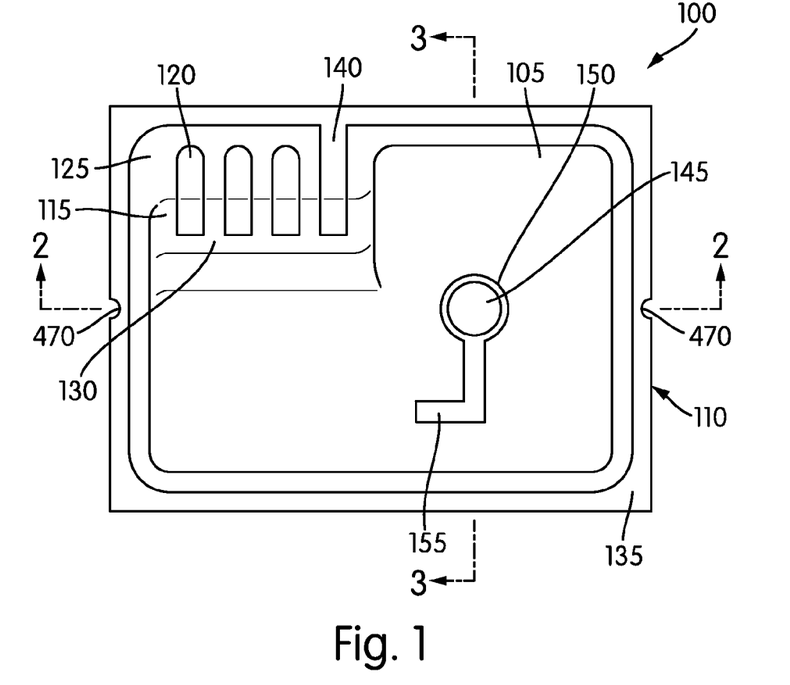
FIG. 1 is a bottom view of a lid of a MEMS microphone package without internal electronic components.

FIGS. 1-7 illustrate multiple views of an embodiment of a lid 100 of a MEMS microphone package. These views illustrate the lid 100 prior to mounting of internal components and prior to attachment of a cap (e.g., substrate). FIG. 1 illustrates an internal-view of the lid 100. The lid 100 includes an interior surface 105 and an exterior surface (shown in FIG. 5). The lid 100 also includes side walls 110. A bonding shelf 115 is positioned in one corner of the lid 100. The bonding shelf 115 may be integrated with the lid as a contiguous molded piece. At least one conductive trace 120 is deposited on the bonding shelf 115. The conductive trace 120 extends along an upper surface 125 of the bonding shelf 115 to a lower surface 130 of the bonding shelf 115. The lid 100 also includes a conductive surface 135 deposited on a top edge of the side walls 110. An extended conductive trace 140 on the bonding shelf 115 extends to the conductive surface 135. The extended conductive trace 140 forms an electrical connection with the conductive surface 135.

The interior surface 105 includes a porthole 145 that passes through the lid 100. A conductive ring 150 is deposited on the interior surface 105 radially around the porthole 145. A conductive trace 155 is also deposited on the interior surface 105 and connected to the conductive ring 150. The conductive ring 150 and the conductive trace 155 provide additional electrical contact points for internal components of the lid 100.

Figure 2:
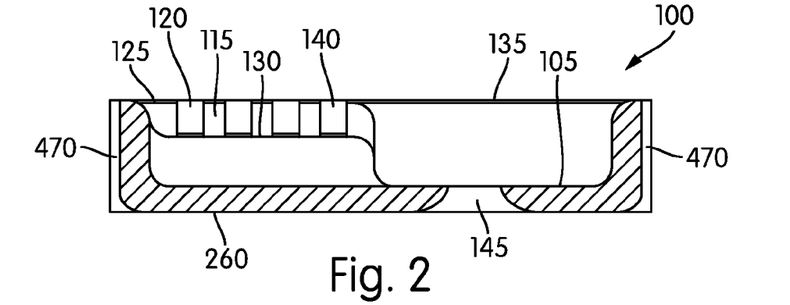
FIG. 2 is a cross-sectional view of the lid of FIG. 1 along a line A-A.

FIG. 2 is a cross-sectional view of the lid 100 along the lines A-A. FIG. 2 illustrates a difference in depth between the upper surface 125 and the lower surface 130 of the bonding shelf 115. The conductive trace 120 and the extended conductive trace 140 extend from the upper surface 125 to the lower surface 130 forming a contiguous conduction path from the upper surface 125 to the lower surface 130. As also illustrated in FIG. 2, the porthole 145 passes through the lid 100 and flares outward towards the exterior resulting in a larger diameter porthole on the exterior surface. Thus, the porthole 145 is tapered inward to funnel acoustic energy toward internal components. The porthole 145 may be formed during the molding process of the lid 100. Alternatively, the porthole 145 may be machined into the lid 100 after the molding process.

Figure 3:
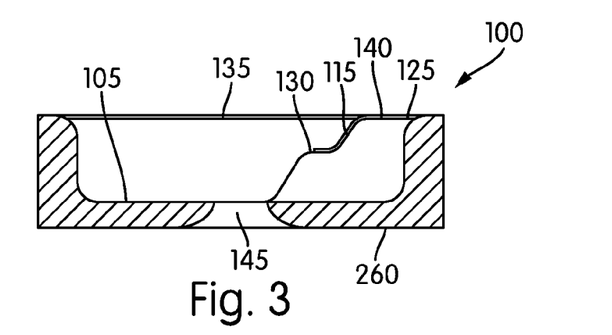
FIG. 3 is a cross-sectional view of the lid of FIG. 1 along a line B-B.

FIG. 3 is a cross-sectional view of the lid 100 along the lines B-B. As illustrated in this view, the bonding shelf 115 may have a smooth, curved transition between the upper surface 125 and the lower surface 130. Therefore, the conductive trace 120 and the extended conductive trace 140 also follow a smooth, curved surface between the upper surface 125 and the lower surface 130. Alternatively, the conductive trace 120 and the extended conductive trace 140 may follow a flat-sloped or other non-curved surface of the bonding shelf 115. A space above the lower surface 130 and between the lower surface 130 and the substrate (not shown) provides space to house wires and connection points for internal components.

Figure 4:
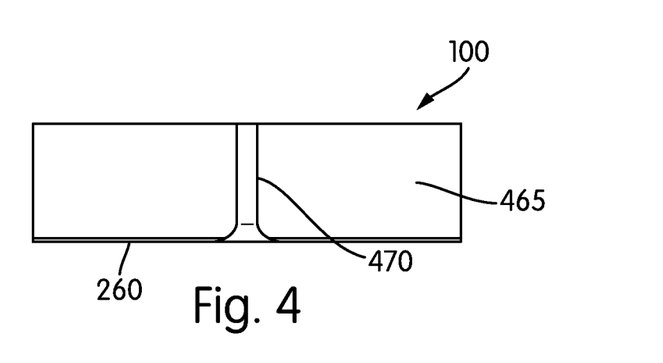
FIG. 4 is an end view of the lid of FIG. 1.

FIG. 4 is an end view of the lid 100 of FIG. 1. In this embodiment, the side surface 465 is constructed of molded plastic and is non-conductive. A semi-cylindrical conductive via 470 forms an indent in one or more of the side walls 110 of the lid 100. The via 470 includes a conductive coating on the inside surface of the via 470 such that the via 470 forms a conductive path between the exterior, bottom surface 260 and the conductive surface 135.

Figure 5:
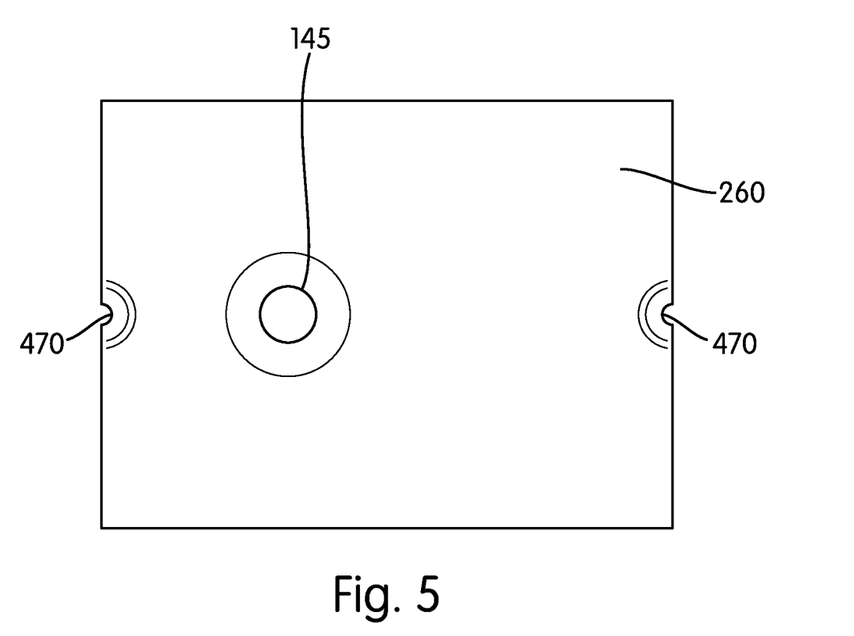
FIG. 5 is a top-view of the lid of FIG. 1

FIG. 5 is an external, top-view of the lid 100. Unlike the side surface 465, the bottom surface is covered with a conductive layer 260. The conductive layer 260 may be a metal deposited on or otherwise formed on the plastic mold. The conductive layer 260 may extend into the porthole 145. Thus, the conductive layer 260 may form an electrical connection with the conductive ring 150 inside the lid 100. The conductive layer 260 may be set to ground potential by the electrical connection though the porthole 145. In this way, the conductive layer 260 forms a portion of a grounded faraday cage to block electromagnetic interference.

Figure 6:
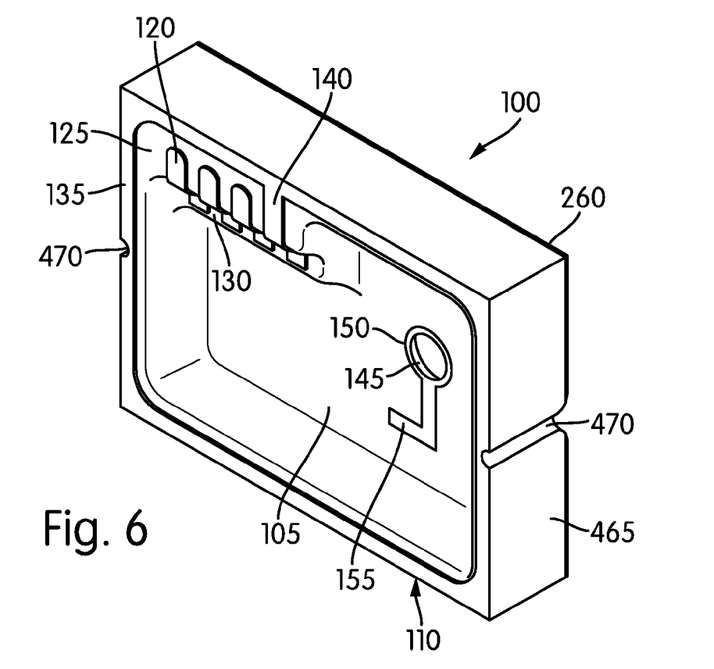
FIG. 6 is a perspective view of the lid of FIG. 1.
Figure 7:
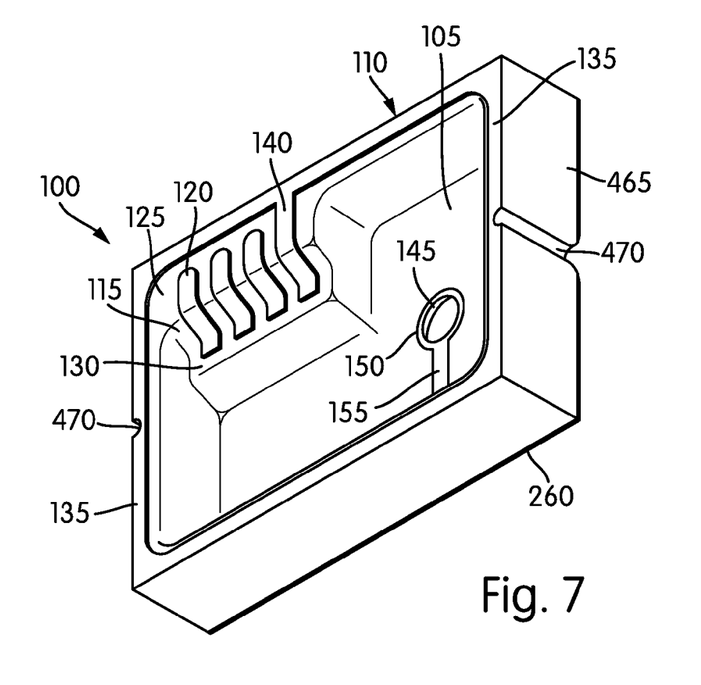
FIG. 7 is an alternate perspective view of the lid of FIG. 1.

FIGS. 6 and 7 are perspective views of the lid 100 as shown in FIGS. 1-5. These perspective views provide integrated views of FIGS. 1-5 from two different viewing angles to aid in understanding of the structure of the lid 100. It should be noted that the lid 100 may be molded of a non-conductive, plastic material. In other embodiments, the lid 100 may be manufactured of other non-conductive materials and machined rather than molded. In some embodiments, the bonding shelf 115 is not molded as part of the lid 100, but rather is attached after the lid 100 has been molded.

Figure 8:
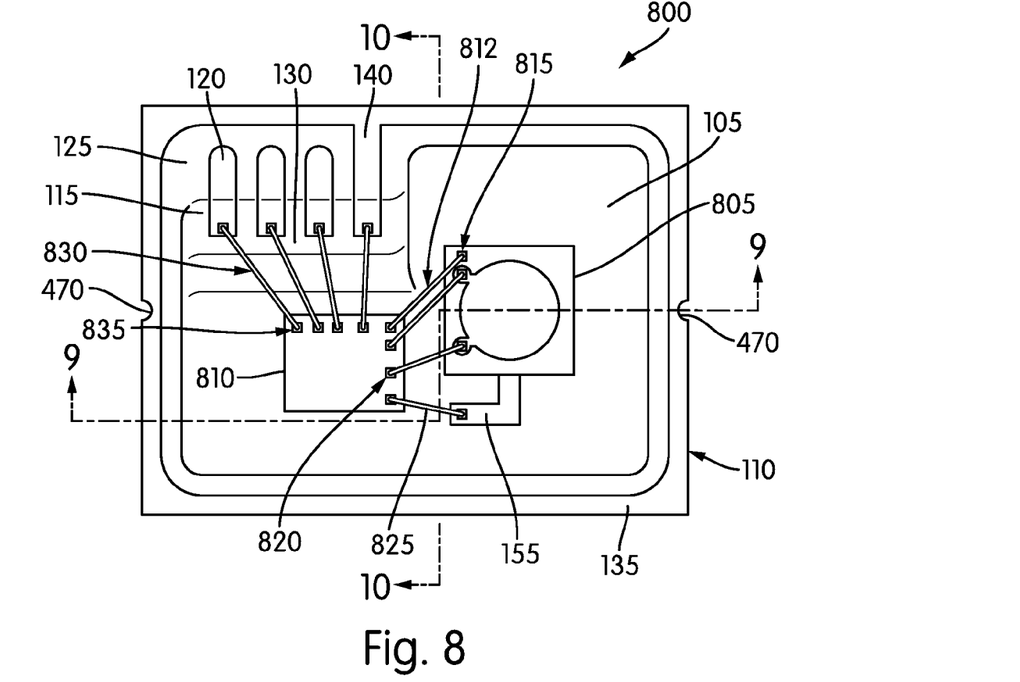
FIG. 8 is a bottom-view of a lid of a MEMS microphone package including internal electronic components.

FIGS. 8-12 illustrate a lid 800, which includes the lid 100 and internal electrical components. As illustrated in FIG. 8, a MEMS microphone die 805 and an ASIC die 810 are attached to the interior surface 105 of the lid 800. The MEMS microphone die 805 is positioned proximal to the ASIC die 810 to provide for convenient electrical connections. One or more wires 812 extend from the MEMS microphone die 805 to the ASIC die 810. The wires 812 are attached to contact points 815 on the MEMS microphone die 805 and contact points 820 on the ASIC die 810. A ground wire 825 is positioned between the ASIC die 810 and the conductive trace 155. The conductive trace 155 and the conductive ring 150 (shown in FIG. 1) thus provide ground connections to the MEMS microphone die 805 and the ASIC die 810. One or more wires 830 are positioned between one or more contact points 835 on the ASIC die 810 and at least one conductive trace 120 on the bonding shelf 115. In addition, a wire 830 is connected to the extended conductive trace 140 to provide an electrical link between the ASIC die 810 and the conductive layer 260.

Figure 9:
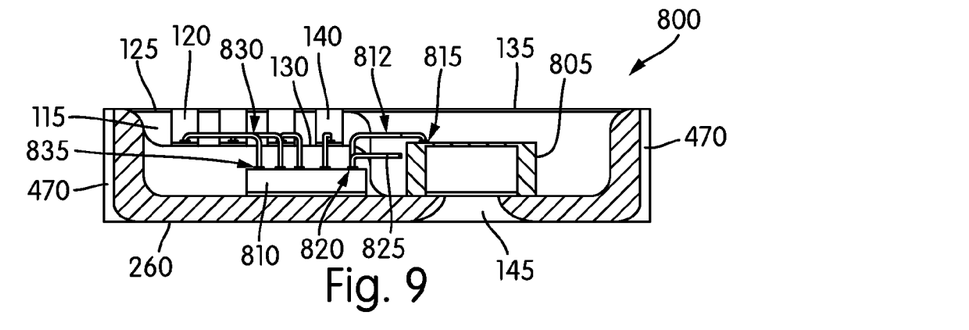
FIG. 9 is a cross-sectional view of the lid of FIG. 8 along a line A-A.
Figure 10:
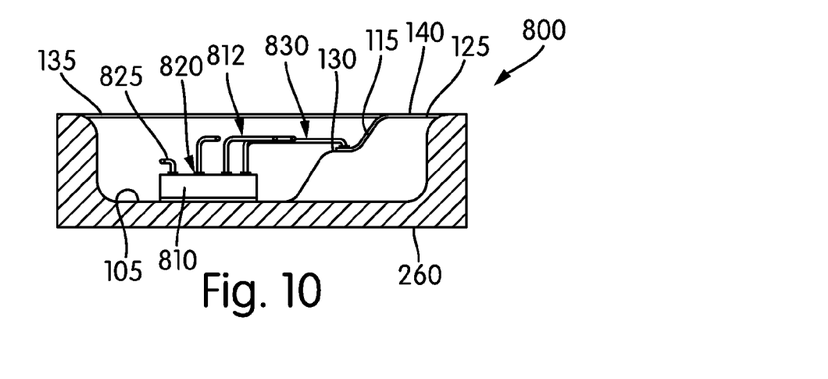
FIG. 10 is a cross-sectional view of the lid of FIG. 8 along a line D-D.
Figure 11:
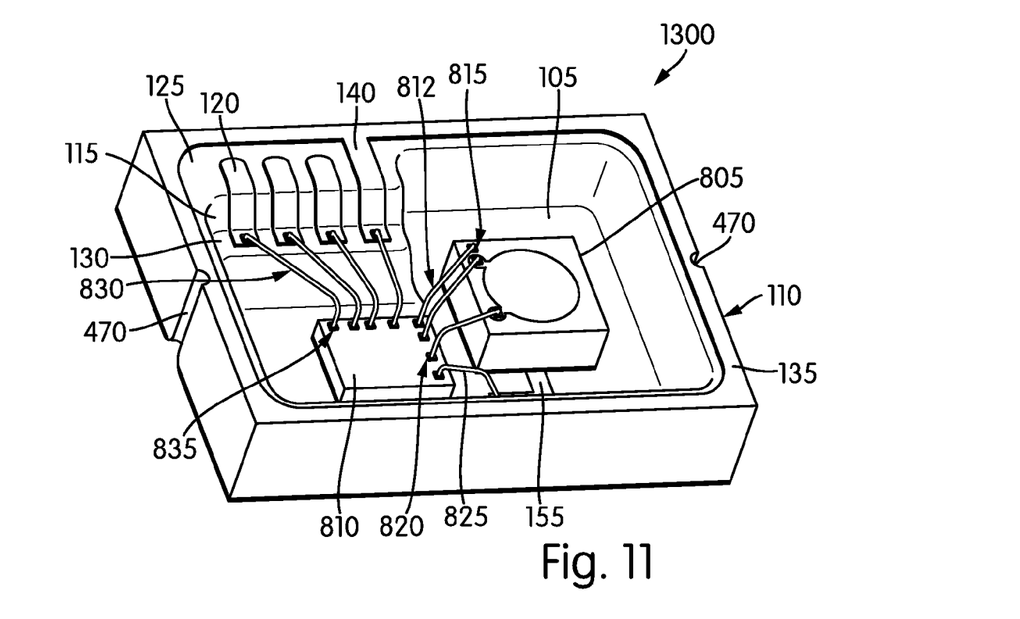
FIG. 11 is a perspective view of the lid of FIG. 8.
Figure 12:
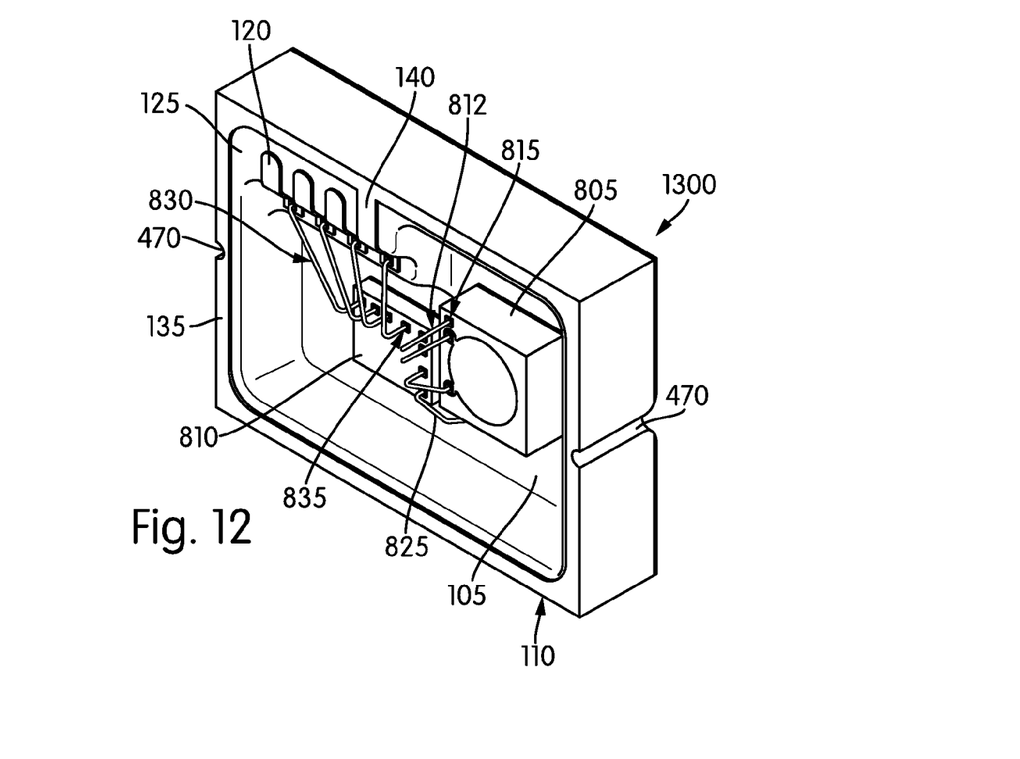
FIG. 12 is an alternate perspective view of the lid of FIG. 8

FIG. 9 is a cross-sectional view of the lid 800 along a line A-A. The MEMS microphone die 805 is positioned to cover the porthole 145. This positioning ensures that acoustic pressure entering the porthole 145 is directed to the diaphragm in the MEMS microphone die 805. FIG. 10 illustrates a cross-sectional view of the lid 800 along line D-D. This view illustrates the connections of the wires 830 to the conductive trace 155 on the bonding shelf 115. FIGS. 11 and 12 are perspective views of the lid 800 further illustrating the structure of the lid 800.

Figure 13:
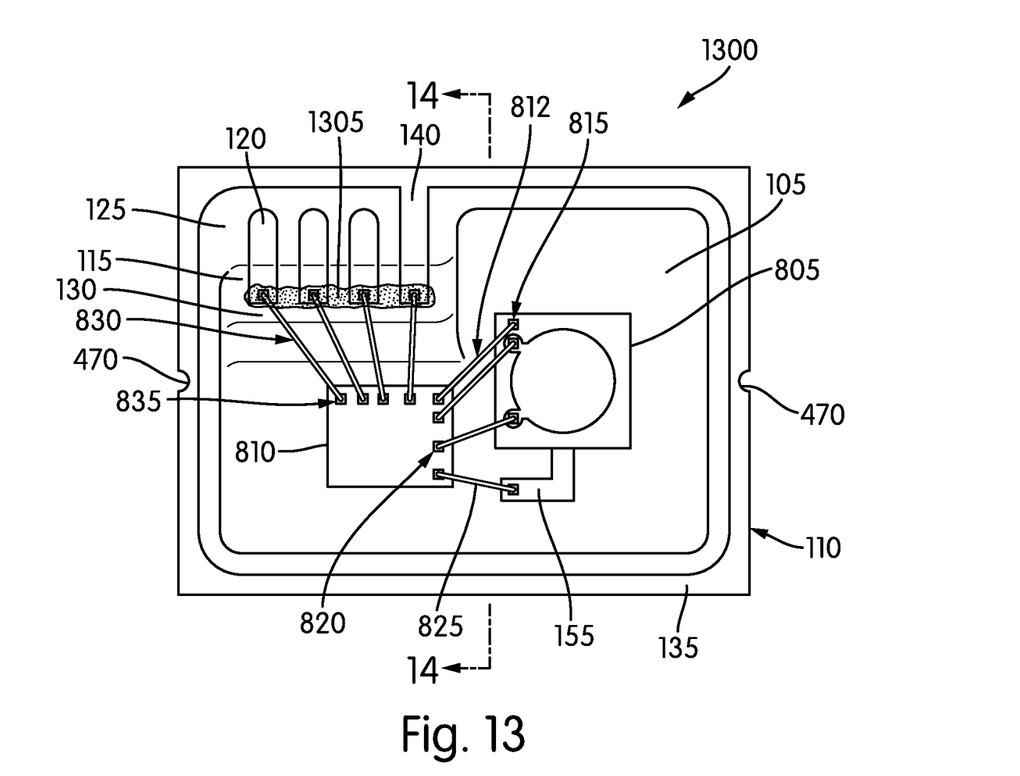
FIG. 13 is a bottom-view of a lid of a MEMS microphone package including a protective coating for wire bonds.
Figure 14:
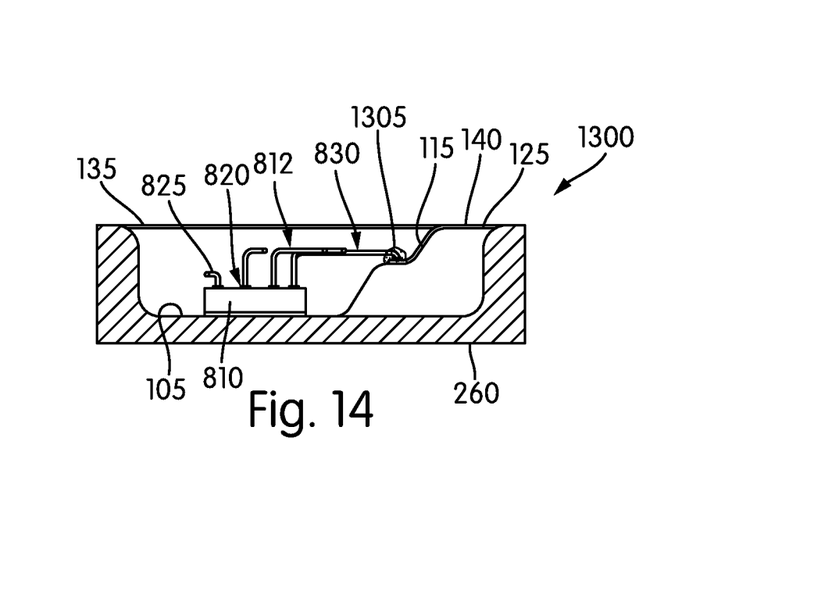
FIG. 14 is a cross-sectional view of the MEMS microphone package of FIG. 13 along a line D-D.
Figure 15:
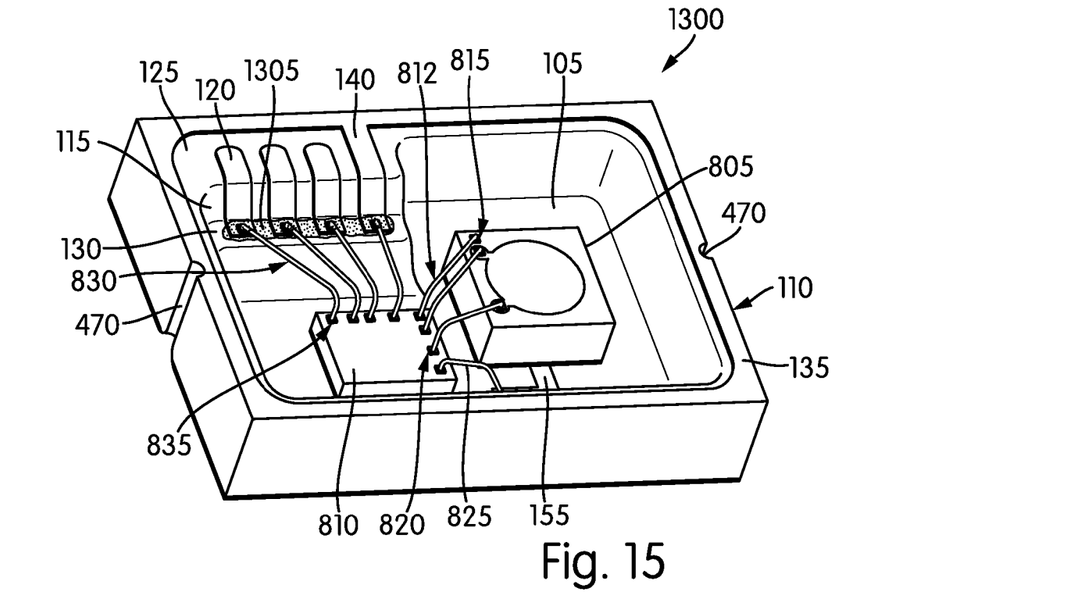
FIG. 15 is a perspective view of the MEMS microphone package of FIG. 13.
Figure 16:
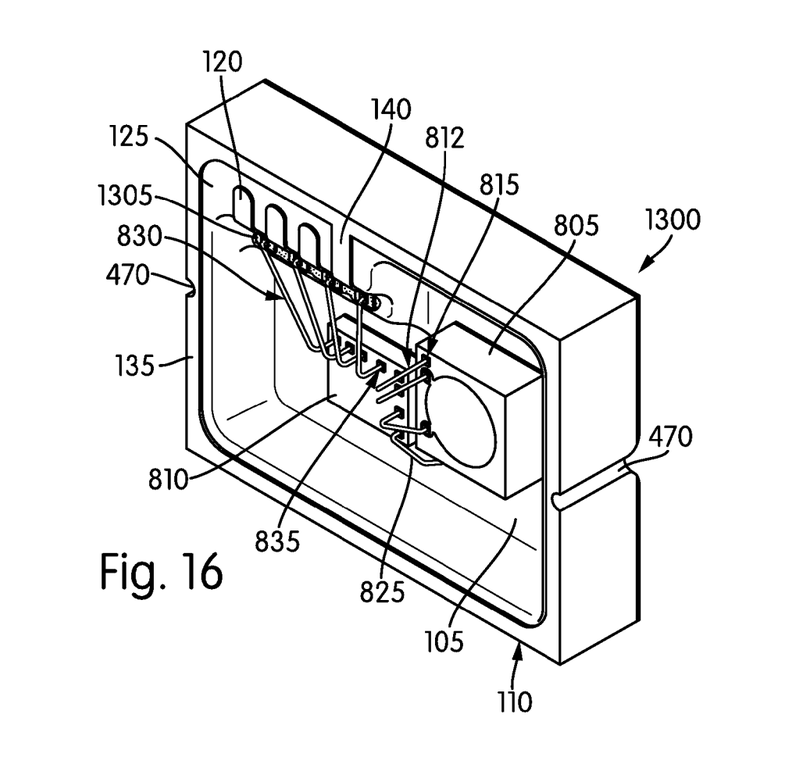
FIG. 16 is an alternate perspective view of the MEMS microphone package of FIG. 13.

FIGS. 13-16 illustrate an embodiment of a lid 1300. In particular, FIGS. 13-16 illustrate the lid 800 with an additional feature. As illustrated in FIG. 13, a protective coating 1305 covers an end of the wires 830 and covers a portion of the conductive trace 120 and the extended conductive trace 140. The protective coating 1305 extends perpendicular to the conductive trace 120 to form a protective strip that provides protection to the wire bonds between the conductive trace 120 and the wires 830. The protective coating 1305 may take various forms and may be formed of various materials. As illustrated in FIG. 14, the protective coating 1305 is a non-conductive glue or epoxy resin that is applied after the wires 830 are soldered to the conductive trace 120. In other embodiments, the protective coating 1305 may be a non-conductive solid piece of material affixed to the bonding shelf 115. In other embodiments, the protective coating 1305 may not be continuous across the wires 830. For example, the protective coating 1305 may take the form of individual drops or separate pieces of material positioned on each of the solder connections between the wires 830 and the conductive trace 120. FIGS. 15 and 16 are perspective views that illustrate the positioning of the protective coating 1305. In some embodiments, the protective coating 1305 may be made of temperature resistant material. For example, the protective coating 1305 may be glue with a melting point well above the melting point of solder.

Figure 17:
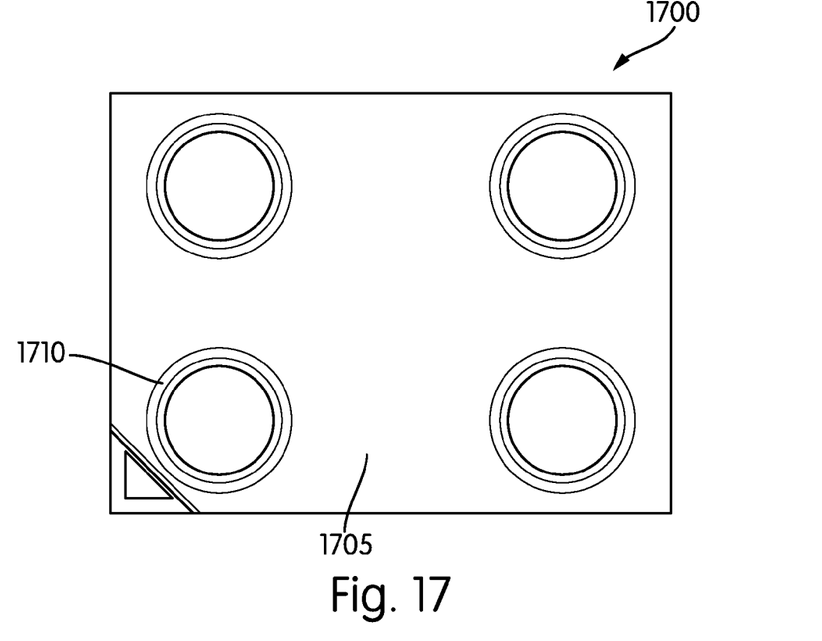
FIG. 17 is a bottom-view of a substrate cap for a MEMS microphone package.
Figure 18:
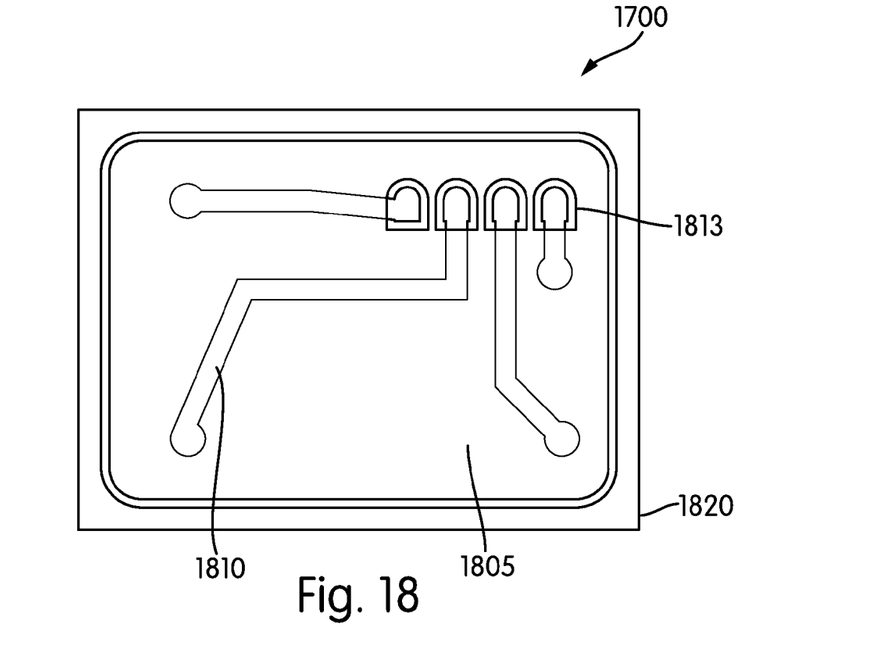
FIG. 18 is a top-view of the substrate cap of FIG. 17.

FIG. 17 is an illustration of a substrate 1700 on an external side 1705. The substrate 1700 may be formed of various materials, for example, laminate printed circuit board (PCB), ceramic, or polyimide. The external side 1705 includes electrical contact pads (e.g., land grid array (LGA) pads) 1710 that provide for electrical connection with other devices. As illustrated in FIG. 18, the contact pads 1710 are routed via traces 1810 on or in the substrate 1700 to a package side 1805 of the substrate 1700. The traces 1810 connect to input/output pads 1815 on the package side 1805 of the substrate 1700. The input/output pads 1815 are aligned to mate with the conductive trace 120 and the extended conductive trace 140 on the upper surface 125 of the bonding shelf 115. Signals from the MEMS microphone die 1805 and the ASIC 1810 are transmitted via the conductive trace 120 to the contact pads 1710. Another electrical contact surface 1820 is provided along the perimeter of the package side 1805 of the substrate 1700. In alternative embodiments, the contact pads 1710 may use other surface mount technologies.

Figure 19:
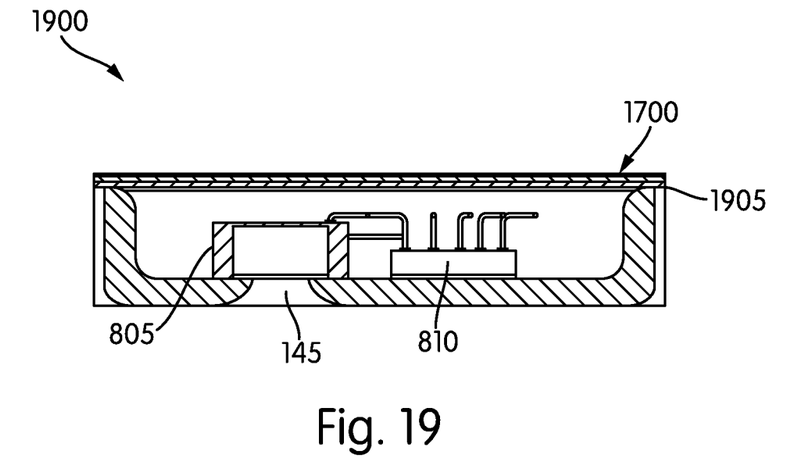
FIG. 19 is a cross-sectional view of an assembled MEMS microphone package.
Figure 20:
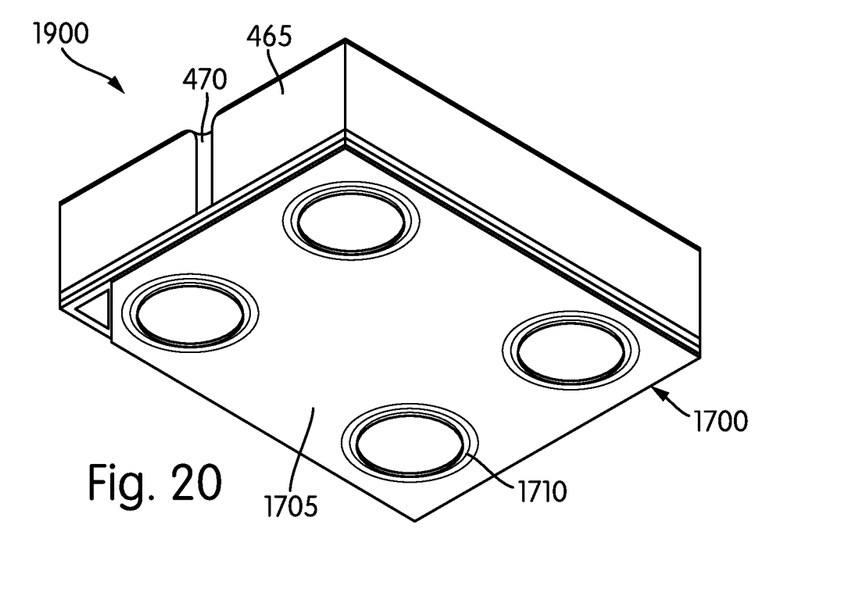
FIG. 20 is a perspective view of the assembled MEMS microphone package of FIG. 19.
Figure 21:
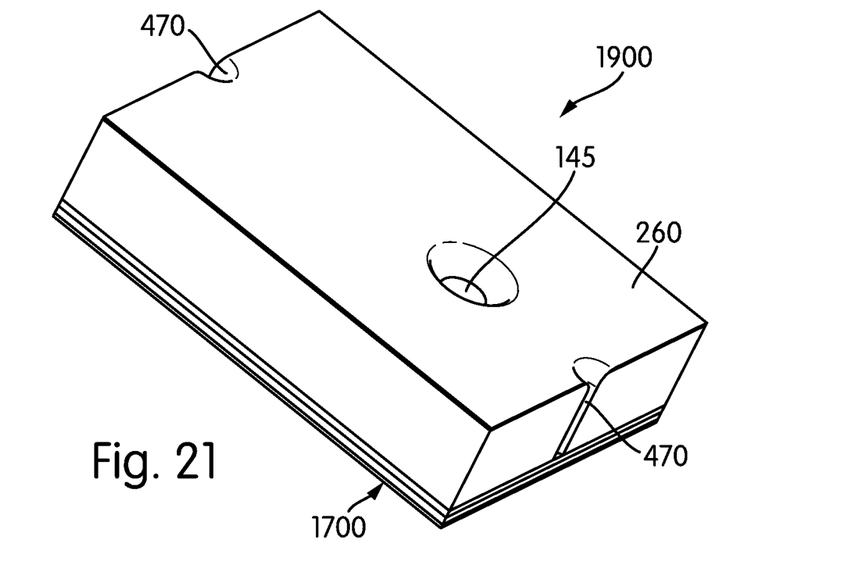
FIG. 21 is an alternate perspective view of the assembled MEMS microphone package of FIG. 19.

FIGS. 19-21 illustrate an assembled MEMS microphone package 1900 including the lid 100, 800, 1300 and the substrate 1700. In particular, FIG. 18 is a cross-sectional view of the MEMS microphone package 1900. As illustrated, the electrical contact surface 1820 on the substrate 1700 mates with the conductive surface 135 on the lid 100. The electrical contact surface 1820 presses against the conductive surface 135 and forms an airtight seal 1905 to prevent material or sound from entering the MEMS microphone package 1900 at the seal 1905. FIGS. 20 and 21 are perspective views of an assembled MEMS microphone package 1900. In particular, FIG. 20 illustrates the substrate 1700 of the MEMS microphone package 1900 and FIG. 21 illustrates the lid 100 of the MEMS microphone package 1900.

Figure 22:
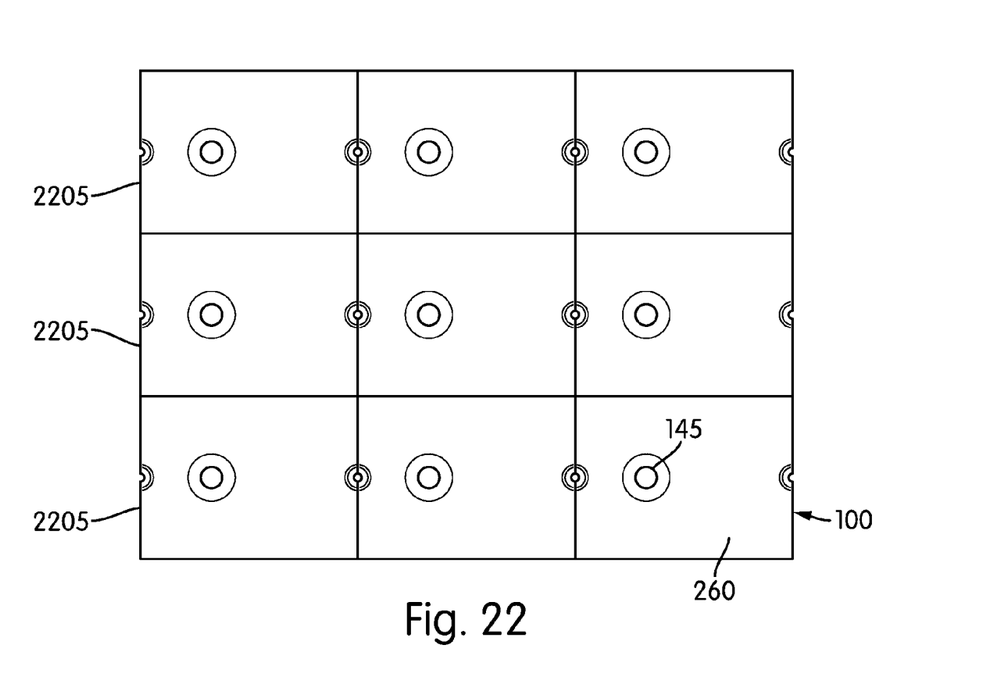
FIG. 22 is a top-view of a lid array.
Figure 23:
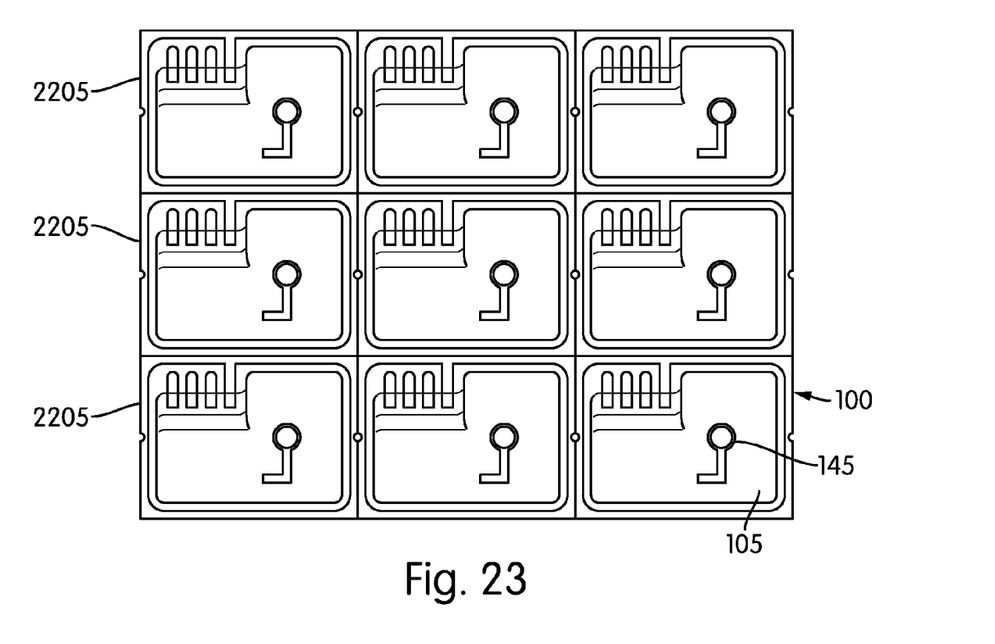
FIG. 23 is a bottom-view of the lid array of FIG. 22.
Figure 24:
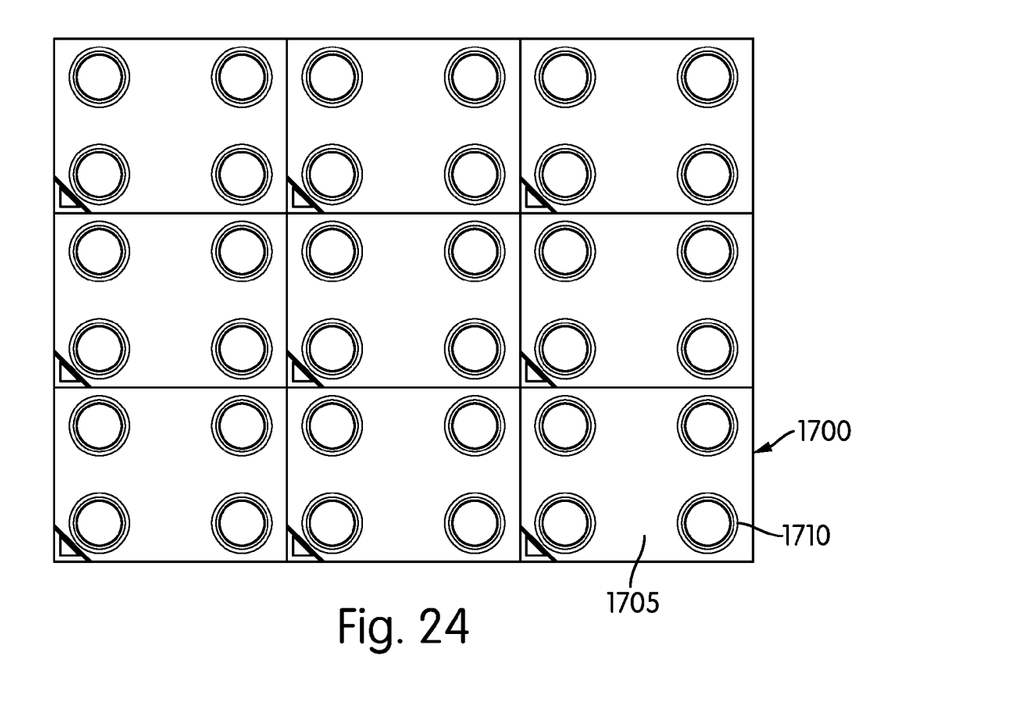
FIG. 24 is a bottom-view of a substrate cap array.
Figure 25:
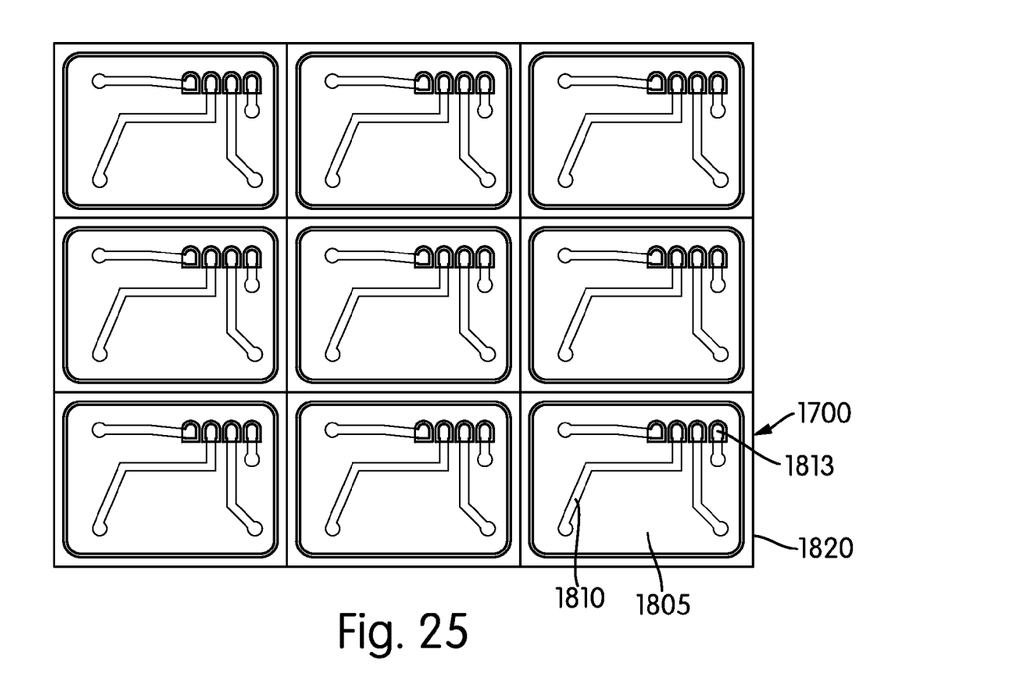
FIG. 25 is a top-view of the substrate cap array of FIG. 24.

FIGS. 22-25 illustrate components of the MEMS microphone package 1900 arranged in an integrated array. FIG. 22 illustrates a top-view of a lid array 2200 including a plurality of lids 2205 prior to singulation. The plurality of lids 2205 including the lid 100. The illustration of the lid array 2200 includes the porthole 145 and the conductive via 470. FIG. 23 illustrates an internal view of the lid array 2200 (i.e., bottom-view). FIG. 24 illustrates an external view (i.e., bottom-view) of a substrate array 2400 including the contact pads 1710. FIG. 25 illustrates an internal view (i.e., top-side) of the substrate array 2400 including the conductive traces 1820 and the input/output pads 1815.

The substrate 1700 is attached to the conductive surface 135 at the seal 1905. The seal 1905 may be formed with solder, which mechanically and electrically connects the substrate 1700 with the conductive surface 135. During the soldering process, excess solder or heat may damage the connections between the wires 830 and the conductive trace 120 and the extended conductive trace 140. The protective coating 1305 prevents the excess solder or heat from directly contacting the wire bond connections. In this way, the bonding shelf 115 provides a surface for glue or similar material to create a solder resist layer that protects wire bonds from subsequent solder-based assembly steps.

Figure 26:
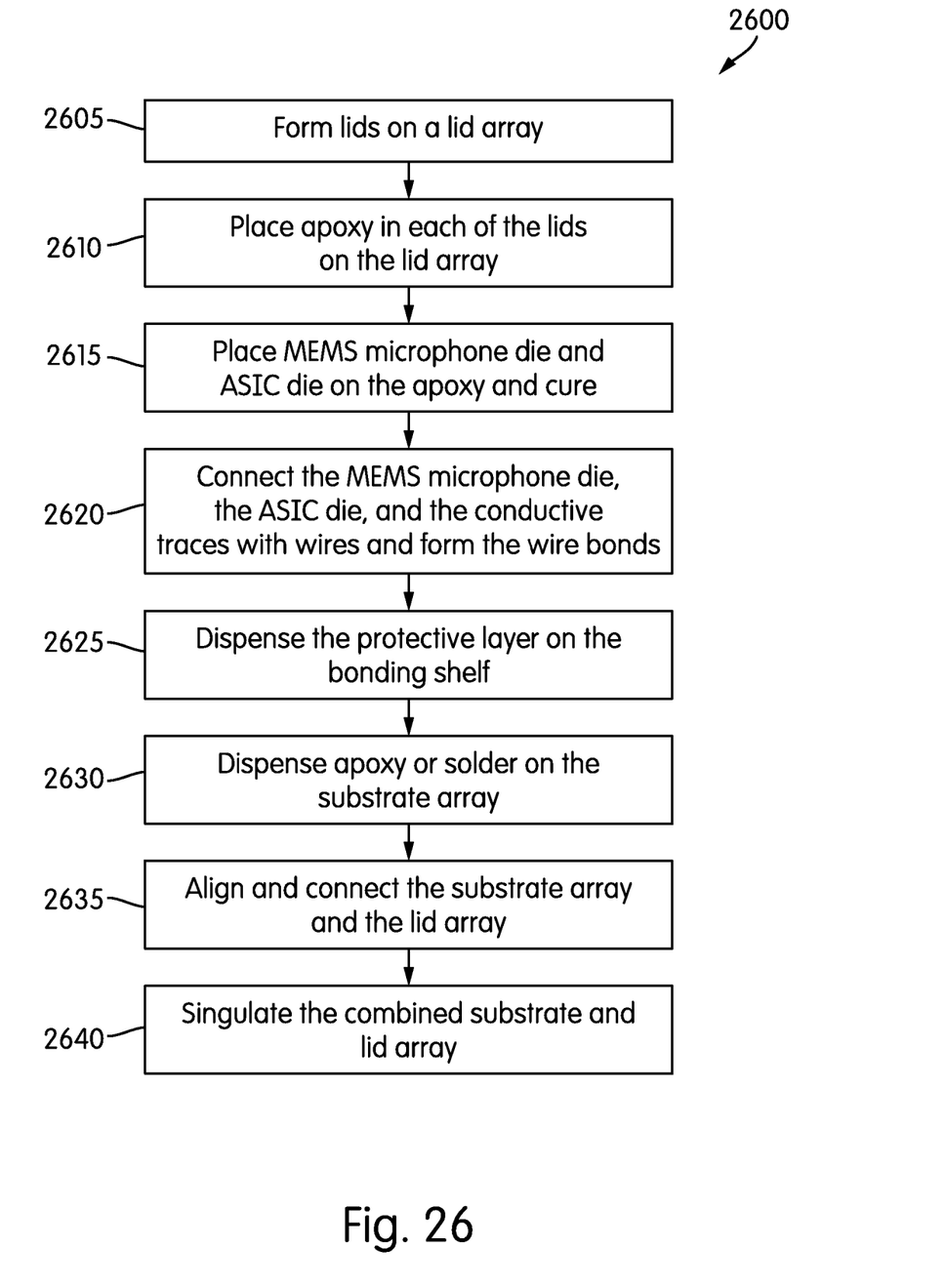
FIG. 26 is a flowchart illustrating a manufacturing method to construct a plurality of MEMS microphone packages.

FIG. 26 is a flowchart illustrating a method 2600 of manufacturing the MEMS microphone package 1900. According to the method 2600, the plurality of lids 2205 is formed as an array 2200 (step 2605). Epoxy is placed in each of the plurality of lids 2205 on the interior surface 105 where the MEMS microphone die 805 and the ASIC die 810 will be positioned (step 2610). For each lid 100 of the plurality of lids 2205, the MEMS microphone die 805 and the ASIC die 810 are positioned on the epoxy and the lid array 2200 is cured (step 2615). The wires 812, the ground wire 825, and the wires 830 are bonded to the contact pads 880, the conductive trace 855, the contact pads 875, and the contact pads 890 of each of the plurality of lids 2205 (step 2620). The protective layer (e.g., epoxy bead) is dispensed on the bonding shelf 115 of each of the plurality of lids 2205, and if epoxy is used, cure (step 2625). Dispense solder or epoxy on the substrate array 2400 such that the solder or epoxy aligns with the conductive surface 135 of each of the plurality of lids 2205 (step 2630). Align and position the substrate array 2400 onto the lid array 2200 and either reflow the solder or cure the epoxy (step 2635). Singulate (e.g., saw) the combination of the lid array 2200 and the substrate array 2400 into each MEMS microphone package 1900 (step 2640).

In the method 2600, covering the bonding shelf 115 with the protective layer in step 2625 protects the wire bonds that are performed in step 2620. In this way, the wire bonds are protected from solder wetting performed in subsequent steps. Therefore, the conductive trace 120 and the extended conductive trace 140 may be connected to the input/output pads 1815 without the use of a solder mask.

Thus, the invention provides, among other things, a plurality of MEMS microphone packages each having a lid and a substrate cap. The lid includes a wire bonding shelf that provides a surface internal to the MEMS microphone for connection points. One or more conductive traces deposited on the bonding shelf connect internal electronic components with a substrate cap. Various features and advantages of the invention are set forth in the following claims.

What is claimed is:

1. A microelectricalmechanical (MEMS) microphone package comprising:
   a substrate cap having an interior and exterior surface;
   a molded lid having an interior surface, an exterior surface, and side walls, the lid attached to the substrate cap such that the substrate cap and the lid form a cavity in the MEMS microphone package;
   an acoustic porthole in the lid;
   a MEMS microphone die positioned proximal to the porthole;
   a bonding shelf located within the cavity, located at a raised position relative to the lid, and being a molded structure; and
   a first electrical trace deposited on the bonding shelf including a first end and a second end, the first end connected to a bonding wire located within the cavity, the second end connected to a contact pad on the interior surface of the substrate cap.

2. The MEMS microphone package of claim 1, further comprising: a seal mechanically and electrically connecting the lid and the substrate cap, the seal providing an airtight seal between the substrate cap and the lid.

3. The MEMS microphone package of claim 2, further comprising:
   a semi-cylindrical conductive via included in a side wall of the lid that provides an electrical connection between a portion of the exterior surface of the lid and the seal ring.

4. The MEMS microphone package of claim 1, wherein a portion of the exterior surface of the lid includes a conductive layer.

5. The MEMS microphone package of claim 1, further comprising an application specific integrated circuit connected to the bonding wire and the MEMS microphone die.

6. The MEMS microphone package of claim 1, wherein the bonding shelf and the lid are molded as a single piece.

7. The MEMS microphone package of claim 1, wherein the first electrical trace extends along a curved surface of the lid, the curved surface extending from the bonding shelf to an upper surface of the lid.

8. A microelectricalmechanical (MEMS) microphone package comprising:
- a substrate cap having an interior and exterior surface;
- a molded lid having an interior surface, an exterior surface, and side walls, the lid attached to the substrate cap such that the substrate cap and the lid form a cavity in the MEMS microphone package;
- an acoustic porthole in the lid, wherein the acoustic porthole is tapered such that the acoustic porthole has a smaller diameter on the interior surface and a larger diameter on the exterior surface;
- a MEMS microphone die positioned proximal to the porthole;
- a bonding shelf located within the cavity, the bonding shelf being a molded structure; and
- a first electrical trace deposited on the bonding shelf including a first end and a second end, the first end connected to a bonding wire located within the cavity, the second end connected to a contact pad on the interior surface of the substrate cap.

9. The MEMS microphone package of claim 8, wherein the conductive layer extends onto a tapered surface of the porthole thereby forming an electrical connection between the exterior surface and a portion of the interior surface, and
wherein the interior surface has a conductive layer deposited radially around the porthole that is electrically connected to the exterior surface via the tapered surface.

10. The MEMS microphone package of claim 9, further comprising a second electrical trace deposited on a portion of the interior surface of the lid that is connected to the conductive layer deposited radially around the porthole.

11. The MEMS microphone package of claim 10, wherein the conductive layer deposited radially around the porthole and the second electrical trace provide a plurality of ground connection points for internal components of the MEMS microphone package.

* * * * *